United States Patent [19]

Rao

[11] Patent Number: 4,949,309

[45] Date of Patent: Aug. 14, 1990

[54] EEPROM UTILIZING SINGLE TRANSISTOR PER CELL CAPABLE OF BOTH BYTE ERASE AND FLASH ERASE

[75] Inventor: Kamesawara K. Rao, San Jose, Calif.

[73] Assignee: Catalyst Semiconductor, Inc., Santa Clara, Calif.

[21] Appl. No.: 192,580

[22] Filed: May 11, 1988

[51] Int. Cl.[5] ............................................ G11C 11/40
[52] U.S. Cl. .................... 365/218; 365/185; 365/104; 357/23.5; 307/465
[58] Field of Search ............... 365/104, 182, 184, 218, 365/189, 185; 357/23.5; 307/465

[56] References Cited

U.S. PATENT DOCUMENTS

| | | | |
|---|---|---|---|
| 4,266,283 | 5/1981 | Perlegos et al. | 365/104 |
| 4,408,305 | 10/1983 | Kuo | 365/189 X |
| 4,408,306 | 10/1983 | Kuo | 365/185 |
| 4,412,309 | 10/1983 | Kuo | 365/184 X |
| 4,531,203 | 7/1985 | Masuoka et al. | 365/218 X |
| 4,698,787 | 10/1987 | Mukherjee et al. | 365/185 X |
| 4,752,871 | 6/1988 | Sparks et al. | 365/218 |
| 4,803,529 | 2/1989 | Masuoka | 365/185 |

OTHER PUBLICATIONS

Samachisa et al., "A 128K Flash EEPROM Using Double-Polysilicon Technology", IEEE Journal of Solid-State Circuits, vol. SC-22, No. 5, Oct. 1987, pp. 676–683.

Mukherjee et al, "A single Transistor EEPROM Cell and Its Implementation in a 512K CMOS EEPROM", I.E.D.M., 1985, pp. 616–619.

Johnson et al., "A 16Kb Electrically Erasable Nonvolatile Memory", IEEE International Solid-State Circuits Conference, 1980, pp. 152–153.

Primary Examiner—Stuart N. Hecker
Assistant Examiner—Alfonso Garcia
Attorney, Agent, or Firm—Skjerven, Morrill, MacPherson, Franklin & Friel

[57] ABSTRACT

An array of floating gate transistors is connected so that some of the floating gate transistors within the array can be erased without affecting the state of other floating gate transistors within the array, or in the alternative, the entire array of floating gate transistors can be erased simultaneously.

4 Claims, 6 Drawing Sheets

First layer polysilicon (floating gates)

Second layer polysilicon (control gates)

Contacts

Metal leads

Boundaries of field oxide

Figure 6

EEPROM UTILIZING SINGLE TRANSISTOR PER CELL CAPABLE OF BOTH BYTE ERASE AND FLASH ERASE

BACKGROUND OF THE INVENTION

1. Field of the Invention

This invention relates to electrically erasable programmable read-only memories (EEPROMs) and more specifically to EEPROMs wherein individual bytes within the EEPROM can be selectively erased or the EEPROM can be flash erased.

2. Description of the Prior Art

EEPROMs are well known in the art. EEPROMs typically comprise arrays of floating gate transistors having a source, a floating gate, a drain, and a control gate. EEPROMs can either be programmed by hot electron injection or by tunneling, and are typically erased by tunneling. In some prior art EEPROMs, different transistors within the array of floating gate transistors are individually erased or erased one byte at a time. See, for example, FIG. 5d and accompanying text of U.S. Pat. No. 4,698,787, issued to Mukherjee, et al., and incorporated herein by reference. Thus, when using such an EEPROM, selected transistors can be erased without destroying the data stored in other transistors. Unfortunately, erasing such an EEPROM is time-consuming.

Other types of EEPROMs can be flash-erased, i.e., the entire array is erased simultaneously. An example of a flash-erase EEPROM is discussed in U.S. Pat. No. 4,531,203 issued to Masuoka et al., incorporated herein by reference. Also see "A 128K Flash EEPROM Using Double-Polysilicon Technology" by G. Samachisa et al., IEEE Journal of Solid-State Circuits, Vol. SC-22, No. 5, October 1987, incorporated herein by reference, and FIG. 5b and accompanying text of the Mukherjee patent. Advantageously, a typical flash EEPROM takes less time to erase than an EEPROM that is erased a bit (or byte) at a time. However, individual bits or bytes in such an EEPROM cannot be erased without erasing the entire EEPROM.

SUMMARY

An EEPROM in accordance with my invention is constructed so that it can be erased in either a first or a second mode. In the first mode, selected individual bytes within the EEPROM array are erased. In a second mode, the entire array can be subjected to a flash-erase. Thus, when it is desired to erase the entire EEPROM by subjecting the EEPROM to flash-erase, it is erased quickly, efficiently, and inexpensively.

EEPROMs capable of individual bit erase typically require two transistors per memory cell—a floating gate transistor and a select transistor to permit erasure of the floating gate transistor without affecting the rest of the array. By building an array capable of byte erase, the array can be constructed using one transistor per cell. However, in another embodiment, the array is constructed to permit erasure of individual bits in the array without disturbing the contents of the entire array.

These and other advantages of my invention are better understood with reference to the detailed description below.

DETAILED DESCRIPTION

Figure 1:
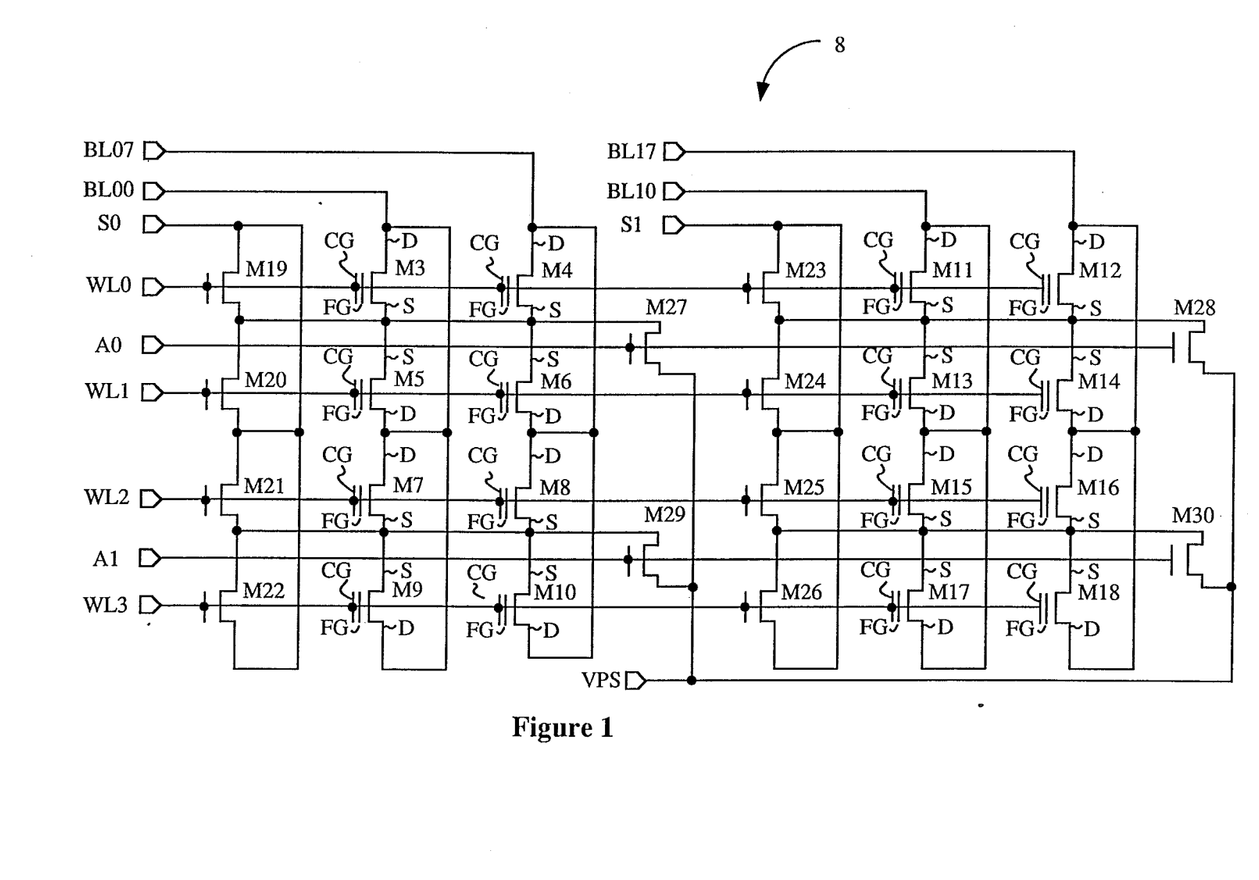
FIGS. 1 to 3 schematically illustrate three embodiments of an EEPROM array constructed in accordance with my invention.

FIG. 1 schematically illustrates an array 8 of N channel floating gate transistors M3 to M18, each floating gate transistor including a source S, a drain D, a control gate CG, and a floating gate FG. (All the transistors in FIG. 1 are N channel enhancement mode transistors). Of importance, electrical charge can be stored on the floating gate of transistors M3 to M18. When the floating gate of a transistor within array 8 is electrically neutral, the transistor stores a logical "1". When the floating gate is negatively charged, the transistor stores a logical "0".

Array 8 of FIG. 1 is organized into rows and columns of floating gate transistors. Thus, a first column of transistors comprises transistors M3, M5, M7, and M9. The drains of each of transistors M3, M5, M7, and M9 are connected to a bit line BL00. The second column of transistors comprises transistors M4, M6, M8, and M10, the drains of which are connected to a bit line BL07. The third column of transistors comprises transistors M11, M13, M15, and M17, the drains of which are connected to a bit line BL10 while the fourth column of transistors comprises transistors M12, M14, M16 and M18, the drains of which are connected to a bit line BL17. Although FIG. 1 illustrates only four columns of transistors, those skilled in the art will recognize that an array of EEPROM cell transistors typically contains a much larger number of columns. For example, six columns of transistors are typically provided between the column coupled to bit line BL00 and the column coupled to bit line BL07, and between the column coupled to bit line BL10 and the column coupled to bit line BL17.

The array is also divided into rows, e.g., the first row of floating gate transistors comprising transistors M3, M4, M11, and M12, the control gates of which are connected to a word line WL0. Similarly, the second row of floating gate transistors comprises transistors M5, M6, M13, and M14, the control gates of which are connected to a word line WL1, the third row of transistors comprises transistors M7, M8, M15, and M16, the control gates of which are connected to a word line WL2, while the fourth row of transistors comprises transistors M9, M10, M17, and M18, whose control gates are connected to a word line WL3. Although only four rows are shown in FIG. 1, typical embodiments include more than four rows of floating gate transistors.

To better understand how the array of FIG. 1 operates, reference is made to Table 1 below.

TABLE 1

Signals for Reading, Programming, Byte Erase and Flash Erase of the Array of FIG. 1

| Lead | Reading M3 and M4 | Byte Program M3 and/or M4 | Byte Erase Transistor M3 and M4 | Flash Erase |
|---|---|---|---|---|
| WL0 | VCC | H2 | 0 volts | 0 volts |
| WL1 | 0 volts | 0 volts | H2 | 0 volts |
| WL2 | 0 volts | 0 volts | 0 volts | 0 volts |
| WL3 | 0 volts | 0 volts | 0 volts | 0 volts |
| BL00 | 1.5 volts | H1/0 | floating | floating |
| BL07 | 1.5 volts | H1/0 | floating | floating |
| BL10 | floating | floating | floating | floating |
| BL17 | floating | floating | floating | floating |
| S0 | 0 volts | 0 volts | H2 | 0 volts |
| S1 | 0 volts | 0 volts | 0 volts | 0 volts |
| A0 | 0 volts | 0 volts | 0 volts | H2 |
| A1 | 0 volts | 0 volts | 0 volts | H2 |
| VPS | 0 volts | 0 volts | 0 volts | H2 |

Assume it is desired to read data stored in floating gate transistor M3. When reading transistor M3, 0 volts are applied to leads S0 and S1 and voltage VCC (typically about 5 volts) is applied to the gate of transistors M19 and M23 via word line WL0. Thus, transistors M19 and M23 are on, thereby applying the signal on lead S0 (0 volts) to the source of transistors M3 to M6 and the signal on lead S1 (also 0 volts) to the source of transistors M11 to M14. The signal on lead A0 is low and therefore transistors M27 and M28 are off, and thus lead VPS is not coupled to the source of transistors M3 to M6 or M11 to M14.

A voltage of 1.5 volts is applied to bit lines BL00 and BL07, and therefore 1.5 volts are applied to the drain of transistors M3 and M4. Since 1.5 volts are applied to the drain of transistor M3, 0 volts are applied to the source of transistor M3, and 5 volts are applied to the control gate of transistor M3, if transistor M3 contains a 1 (i.e. the floating gate of transistor M3 is electrically neutral), current will flow from bit line BL00, through transistor M3, through transistor M19 and to ground. However, if transistor M3 contains a 0 (i.e. the floating gate of transistor M3 is negatively charged), current will not flow through transistor M3, even when 5 volts are applied to word line WL0, the source of transistor M3 is grounded, and 1.5 volts are applied to the drain of transistor M3. Thus, by sensing the current through transistor M3 under the conditions set forth in the Read column of Table 1 above, the data stored in transistor M3 can be determined.

It will be appreciated that transistor M4 is read concurrently with transistor M3. Thus, while reading the state of transistor M3, 1.5 volts are also applied to line BL07, and therefore the data stored in transistor M4 is sensed by sensing the current through bit line BL07.

Although the drains of transistors M5, M7 and M9 are connected to bit line BL00, transistors M5, M7 and M9 will not draw current when transistor M3 is being read because the control gates of transistors M5, M7 and M9 are connected to word lines WL1, WL2 and WL3, respectively, which are tied to ground. Thus, transistors M5, M7 and M9 are off when transistor M3 is being read.

Transistor M3 is programmed (i.e. electrons are stored on the floating gate of transistor M3) by raising the voltage at bit line BL00 to a high voltage, e.g. 5 to 8 volts, applying a high voltage to word line WL0 (typically 12 volts) and grounding lead S0. (The designation H1 in Table 1 above designates a voltage between 5 and 8 volts. H1/0 means 5 to 8 volts are applied to a bit line to store a "0" in an associated transistor, while 0 volts are applied to the bit line if it is desired to leave the transistor undisturbed. The designation H2 designates a voltage greater than or equal to about 12 volts.) Of importance, because lead WL0 receives a high voltage and lead S0 is grounded, transistor M19 is on, and the source of transistor M3 is connected to ground through transistor M19. When the voltage at bit line BL00 is high (5 to 8 volts) and the voltage at word line WL0 is high (and therefore the voltage at the control gate of transistor M3 is also high), hot electrons are injected onto the floating gate of transistor M3.

Of importance, transistor M4 can be programmed concurrently with transistor M3 by applying a high voltage to bit line BL07.

Word lines WL1 to WL3 are grounded during programming of transistors M3 and M4, and therefore a high voltage is not applied to the control gates of transistors M5 to M10 during programming of transistors M3 and M4, and thus transistors M5 to M10 are not programmed while transistors M3 and M4 are being programmed.

Similarly, during programming of transistors M3 and M4, bit lines BL10 and BL17 are grounded, and thus the drains of transistors M11 and M12 are grounded. Thus, transistors M11 and M12 are also not programmed when transistors M3 and M4 are programmed.

During byte erase, line WL1 is held at a high voltage (e.g., greater than 12 volts), while word lines WL0, WL2, and WL3 are grounded. Also, bit lines BL00, BL07, BL10, and BL17 are floating, lead S0 is held at about 12 volts, and leads S1, A0, A1, and VPS are held at ground. Because word line WL1 is held at a high voltage, 12 volts are applied to the source of transistors M3 and M4 via lead S0 and transistor M20. Thus, during byte erase, 12 volts are applied to the source of transistors M3 and M4, bit lines BL00 and BL07 are floating, and the control gate of transistors M3 and M4 are held at ground by lead WL0. This causes a high electric field to develop across the insulation separating the floating gates of transistors M3 and M4 and the sources of transistors M3 and M4, which in turn causes electrons to tunnel from the floating gates of transistors M3 and M4, to their source, thereby resulting in the erasure of transistors M3 and M4. Of importance, during erasure of transistors M3 and M4, both the source and control gate of transistors M5 and M6 are held at a high voltage, and therefore a high electric field will not develop across the insulation between the source and floating gate of transistors M5 and M6, and therefore, transistors M5 and M6 will not be erased during erasure of transistors M3 and M4. Similarly, during electrical erase, the control gates of transistors M7 to M10 are held at ground and the source and drain of transistors M7 to M10 are floating. Therefore, transistors M7 to M10 are also not erased during erasure of transistors M3 and M4. It is noted that during byte erase of transistors M3 and M4, lead S1 is grounded. Thus, transistors M11 and M12 remain undisturbed because both their source and control gate are grounded.

During byte erasure of transistors M3 and M4, the control gates of transistors M13 and M14 are held at a high voltage and the source of transistors M13 and M14 are grounded However, this condition will not affect the state of transistors M13 and M14, e.g., by causing electrons to tunnel from their sources to their control gates because of the relative capacitive coupling between the floating gates and the other structures in the transistors.

During flash erasure of the entire array, bit lines BL00, BL07, BL10, and BL17 are floating, word lines WL0 to WL3 are held at ground, leads A0 and A1 are held at a high voltage (e.g. greater than about 12 volts) and lead VPS is held at a high voltage. Because of this, a high voltage is applied to the source of transistors M3 to M6 via lead VPS and a bulk erase transistor M27, while a high voltage is applied to the source of transistors M7 to M10 via lead VPS and a bulk erasure transistor M29. Thus, the voltage at the source of transistors M3 to M10 is high while the voltage at the control gates of transistors M3 to M10 is low, thereby causing a high electric field which causes electrons to tunnel from the floating gate to the source of transistors M3 to M10. Transistors M11 to M18 are erased in a similar manner.

While Table I above discloses the manner in which transistors M3 and M4 are read, programmed and erased, it will be appreciated that transistors M5 to M18 are read, programmed and erased in a similar manner. Thus, if it was desired to read transistor M11, one would apply 1.5 volts to bit line BL10 and 5 volts to word line WL0, cause bit lines BL00 and BL07 to float and ground leads S0, S1, VPS, A0, A1 and WL1 to WL3. To program transistor M11, a voltage of 5 to 8 volts would be applied to bit line BL10 and about 12 volts would be applied to word line WL0, bit lines BL00 and BL07 would be caused to float, and leads S0, S1, VPS, A0, A1 and WL1 to WL3 would be grounded.

It will be appreciated that individual groups of transistors in array 8 of FIG. 1 can be erased without altering the other transistors in the array, or in the alternative, array 8 of FIG. 1 can be flash-erased. This represents a major improvement over prior art EEPROMs.

It will also be appreciated that the six transistors typically present (but not illustrated) between transistors M3 and M4 are read, programmed and byte-erased simultaneously.

Figure 2:
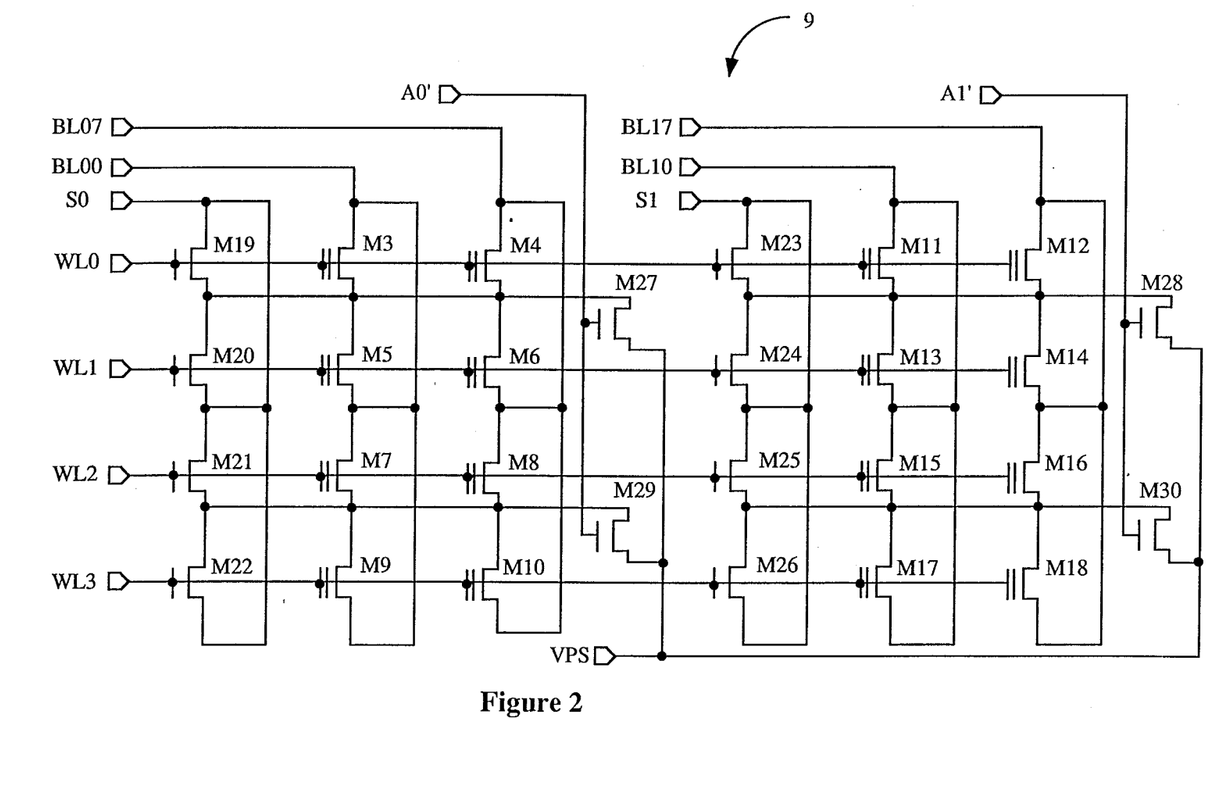

FIG. 2 schematically illustrates an array 9 of floating gate transistors constructed in accordance with another embodiment of my invention. Array 9 is similar to the array 8 of FIG. 1 except that instead of providing lines A0 and A1 parallel to word lines WL0 to WL3, leads A0' and A1' are provided which are parallel to bit lines BL00, BL07, BL10 and BL17. The transistors in array 9, like the transistors in FIG. 1, are typically N channel enhancement mode transistors. The signals used to read, program and erase the transistors in the array of FIG. 2 are the same as in the array of FIG. 1. Lines A0, A1, A0' and A1' of arrays 8 and 9 are controlled so that they all receive 0 volts simultaneously or they all receive about 12 volts simultaneously. Thus, in array 8, lines A0 and A1, and in array 9, lines A0' and A1' can be replaced by a single line.

Figure 4:
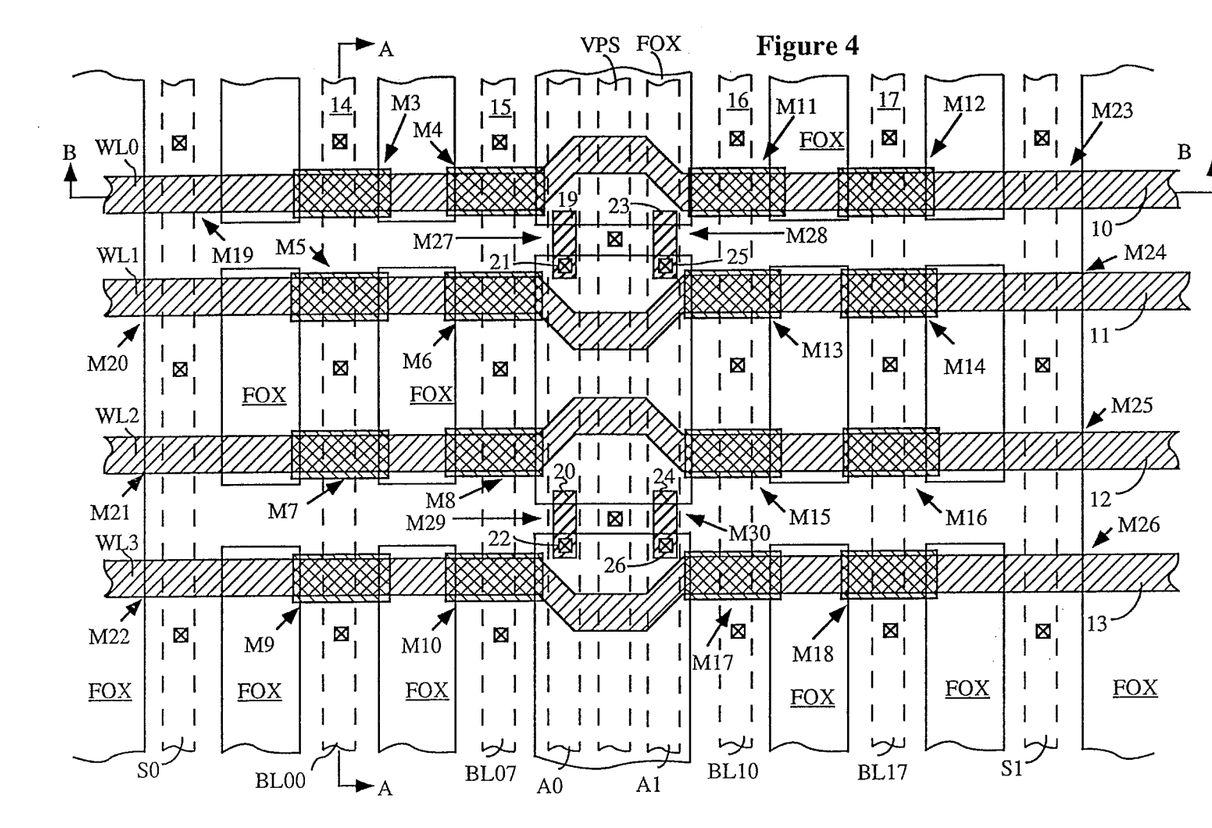
FIG. 4 illustrates in plan view an EEPROM array constructed in accordance with the embodiment of FIG. 2.

FIG. 4 illustrates array 9 in plan view. As can be seen, word line WL0 is a polysilicon strip 10 which serves as a gate for transistors M19 and M23 and a control gate for transistors M3, M4, M11 and M12. Similarly, word lines WL1 to WL3 are polysilicon strips 11 to 13, respectively. Bit lines BL00, BL07, BL10 and BL17 are metal strips 14 to 17, respectively, which electrically contact the drains of various transistors within associated columns of transistors of the array. The source of transistors M3 to M6 is coupled to lead S0 via either transistors M19 or M20 (depending on the state of word lines WL0 and WL1) or to lead VPS via transistor M27. Lead A0 is connected to gates 19 and 20 of transistors M27 and M29 via contacts 21 and 22, respectively, while lead A1 is connected to gates 23 and 24 of transistors M28 and M30 via contacts 25 and 26, respectively.

FIG. 4 also illustrates field oxide regions F0X which separate the various transistors. Of importance, field oxide F0X and polysilicon strips 10 to 13 are formed prior to the source/drain implants. Thus, the source/drain regions do not pass underneath polysilicon strips 10 to 13 or oxide regions F0X.

Figure 5A:
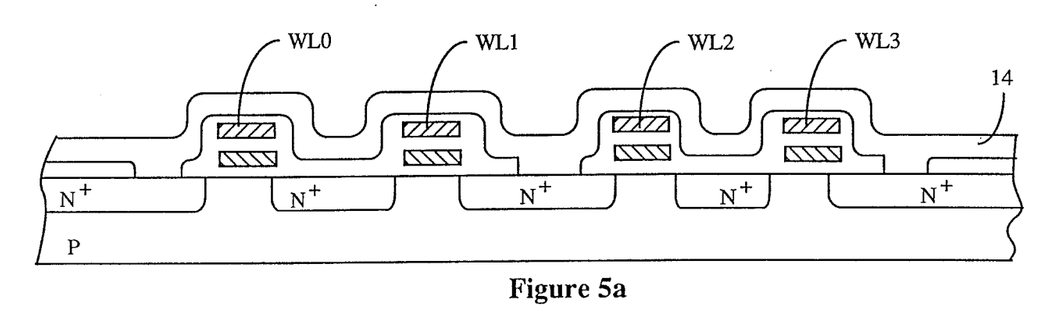
FIGS. 5a and 5b illustrate in cross section portions of the array of FIG. 4 along lines AA and BB respectively.
Figure 5B:
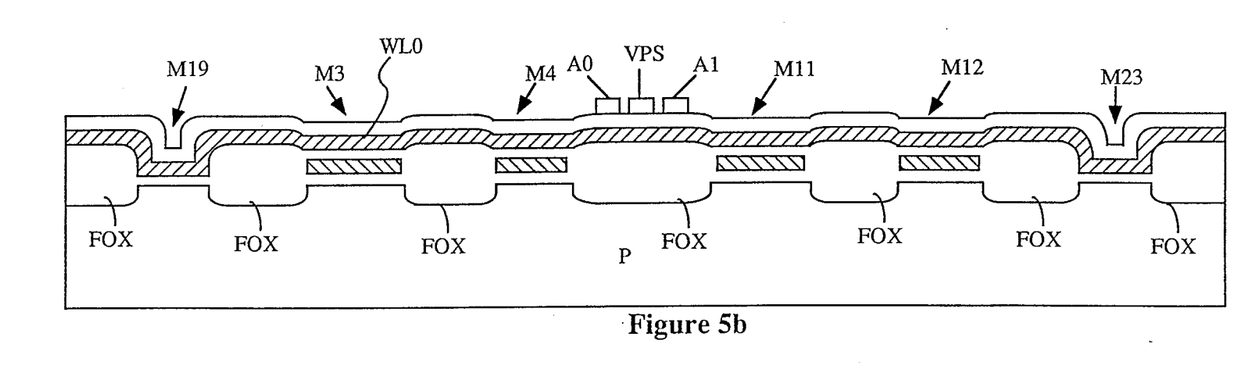
Figure 6:
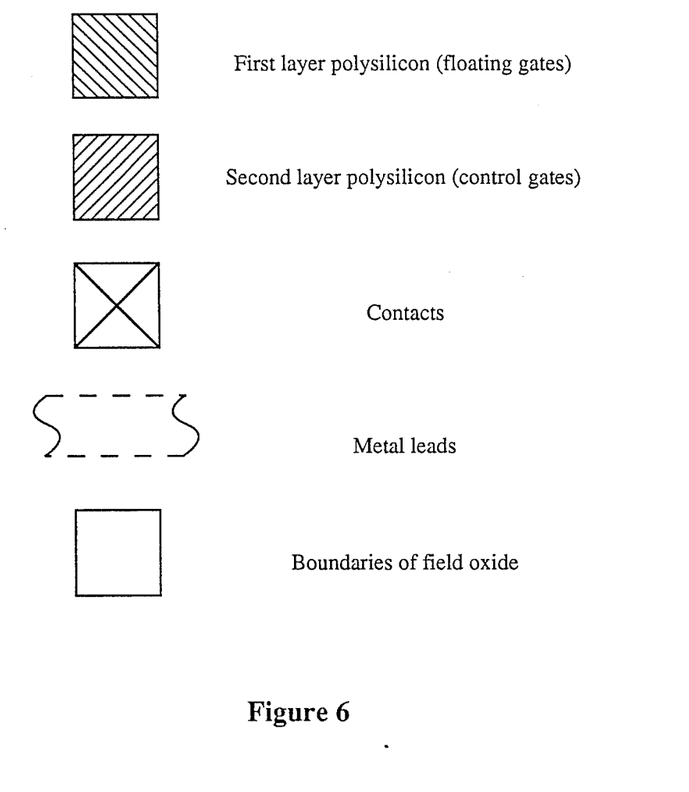
FIG. 6 illustrates the symbols used in FIG. 4.

FIG. 6 illustrates the symbols used in FIG. 4. FIGS. 5a and 5b illustrate in cross section array 9 of FIG. 4 along lines AA and BB respectively.

As mentioned above, typically 6 floating gate transistors (not shown) are provided between transistors M3 and M4, and six bit lines are provided between bit lines BL00 and BL07 so that array 9 is organized into bytes. Thus, array 9 can be erased a byte at a time. However, in other embodiments, EEPROM array 9 is constructed so that words of different bit lengths can be simultaneously erased. In yet other embodiments array 9 is constructed so that individual bits can be erased (e.g. so that only one column of transistors is formed between metalization line A0 and the column comprising transistors M19 to M22).

Figure 3:
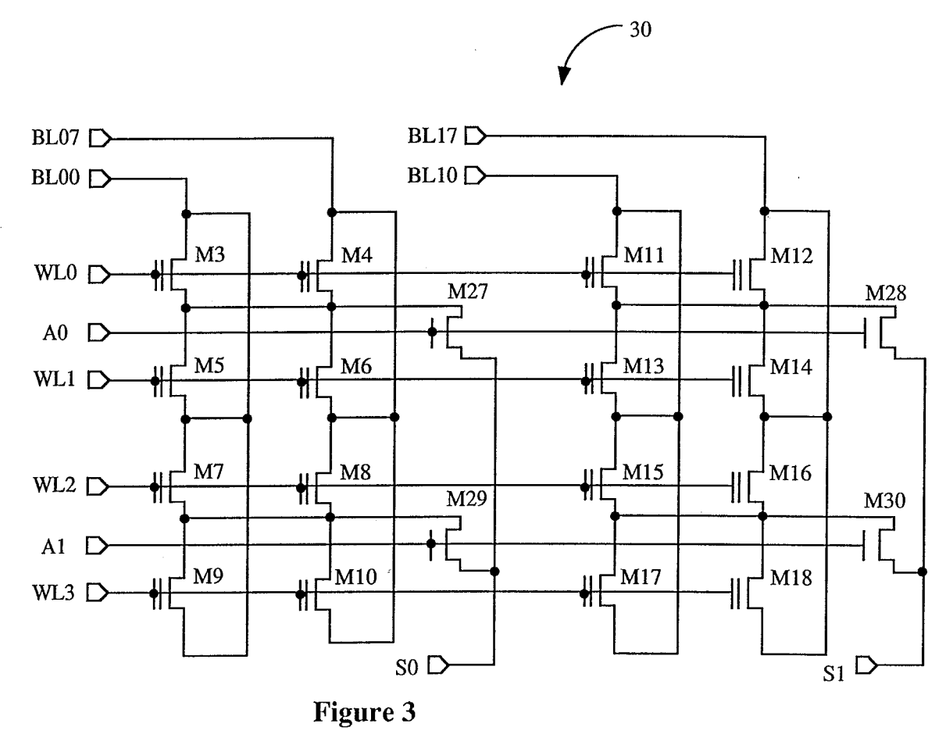

FIG. 3 illustrates an array 30 of transistors constructed in accordance with another embodiment of my invention. Array 30 is similar to array 8 of FIG. 1 except lead VPS and transistors M19 to M26 are eliminated. Leads S0 and S1 are connected to the sources of floating gate transistors M3 to M19 of array 30 via transistors M27 to M30. Either a high voltage or a low voltage is applied to leads S0 and S1 depending upon whether or not the transistors of array 30 are to be erased.

Table 2 below indicates the voltages to be applied to the various structures in array 30 to read, program, byte erase and flash erase array 30.

TABLE 2

| Lead | Reading M3 and M4 | Byte Program M3 and M4 | Byte Erase | Flash Erase |
|---|---|---|---|---|
| WL0 | VCC | H1 | 0 volts | 0 volts |
| WL1 | 0 volts | 0 volts | H2 | 0 volts |
| WL2 | 0 volts | 0 volts | 0 volts | 0 volts |
| WL3 | 0 volts | 0 volts | 0 volts | 0 volts |
| BL00 | 1.5 volts | H1/0 | floating | floating |
| BL07 | 1.5 volts | H1/0 | floating | floating |
| BL10 | floating | floating | floating | floating |
| BL17 | floating | floating | floating | floating |
| S0 | 0 volts | 0 | H2 | H2 |
| S1 | 0 volts | 0 | 0 volts | H2 |
| A0 | VCC | H1 | H2 | H2 |
| A1 | VCC | H1 | 0 volts | H2 |

The operation of array 30 is similar to that of arrays 8 and 9, and will thus not be discussed in further detail. It will be noted, however, that array 30 has fewer transistors then arrays 8 and 9, and is thus less expensive to build.

FIG. 3 shows lines S0 and S1 parallel to the bit lines and lines A0 and A1 parallel to the word lines. However, in other embodiments, lines S0 and S1 are parallel to the word lines and lines A0 and A1 are parallel to the bit lines.

The EEPROM array of the present invention can be constructed using various known processing steps and cell architectures. However, the EEPROM array of the present invention can also be constructed using the process steps and architecture described in sending U.S. patent application No. 179,196, entitled "High Density EEPROM Cell and Process for Making the Cell" filed by Steve K. Hsia et al., on Apr. 8, 1988, assigned to the Assignee of the present invention, and incorporated herein by reference.

While the invention has been described with regard to specific embodiments, those skilled in the art will recognize that changes can be made in form and detail without departing from the spirit and scope of the invention. For example, instead of erasing the transistors by causing electrons to tunnel between the source and floating gate, in other embodiments, electrons are caused to tunnel between the drain and floating gates. Accordingly, all such changes come within the present invention.

I claim:

1. Circuit comprising:
   a first region of semiconductor material;
   an array of floating gates organized into rows and columns, each of said floating gates being formed above but insulated from said first region of semiconductor material, each row of floating gates being organized into groups of floating gates within said row;
   a plurality of control gate leads, each control valve lead being associated with one of said rows of floating gates, wherein each control gate lead extends over but is insulated from the floating gates within the associated row of floating gates;
   a plurality of common source/drain regions formed within said first region of semiconductor material such that each common source/drain region is bordered on a first side by a first group of said floating gates from one of said rows while a second side is bordered by another group of said floating gates from another of said rows;
   a plurality of source/drain regions formed within said first region of semiconductor material adjacent at least one of said floating gates such that each floating gate separates an associated one of said source/drain regions within said plurality from one of said common source/drain regions;
   means for applying an erase voltage to said common source/drain regions in a first mode and a second mode such that in said first mode, all of said common source/drain regions simultaneously receive said erase voltage so that all of said floating gates are simultaneously erased, and in said second mode, fewer than all of said common source/drain regions receive said erase voltage so that fewer than all of said floating gates are erased.

2. Circuit of claim 1 wherein said means for applying comprises:
   a first group of transistors, each transistor within said first group being associated with one of said rows and having a gate coupled to the control gate lead associated with said one row, a first side of each gate of said first group of transistors being placed adjacent a first portion of the perimeter of an associated one of said common source/drain regions, a plurality of erase regions formed within said first region of semiconductor material, each of said erase regions being formed adjacent a second side of an associated one of said gates; and
   means for applying an erase voltage to said plurality of erase regions;
   wherein said first group of transistors determine whether said erase voltage at said erase regions is applied to the common source/drain regions associated with said group of transistors.

3. Circuit of claim 2 wherein said first group of transistors is used to erase floating gate transistors during said second mode, said circuit further comprising an additional group of transistors, each transistor within said additional group being formed adjacent a second portion of the perimeter of an associated common source/drain region and applying an erase voltage to said common source/drain region during said first mode of operation.

4. Circuit of claim 1 further comprising a plurality of erase transistors, each erase transistor being associated with one of said common source/drain regions and having a gate formed adjacent said associated common source/drain region, each of said erase transistors also having an additional source/drain region formed such that said gate separates said additional source/drain region from said associated common source/drain region, said additional source/drain region being coupled to receive said erase voltage, whereby said erase transistors can be used to apply said erase voltage to said common source/drain regions.

* * * * *